(12) United States Patent
Wang et al.

(10) Patent No.: US 10,572,052 B2
(45) Date of Patent: Feb. 25, 2020

(54) PRESSURE FORCE TOUCH PANEL AND METHOD FOR MANUFACTURING THE SAME, AND DISPLAY APPARATUS

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Haisheng Wang, Beijing (CN); Xue Dong, Beijing (CN); Hailin Xue, Beijing (CN); Xiaochuan Chen, Beijing (CN); Xiaoliang Ding, Beijing (CN); Yingming Liu, Beijing (CN); Shengji Yang, Beijing (CN); Rui Xu, Beijing (CN); Changfeng Li, Beijing (CN); Wei Liu, Beijing (CN); Pengpeng Wang, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 250 days.

(21) Appl. No.: 15/522,760

(22) PCT Filed: Jun. 28, 2016

(86) PCT No.: PCT/CN2016/087439
§ 371 (c)(1),
(2) Date: Apr. 27, 2017

(87) PCT Pub. No.: WO2017/156915
PCT Pub. Date: Sep. 21, 2017

(65) Prior Publication Data
US 2018/0088720 A1    Mar. 29, 2018

(30) Foreign Application Priority Data

Mar. 15, 2016  (CN) .......................... 2016 1 0147019

(51) Int. Cl.
*G06F 3/041* (2006.01)
*H01L 27/20* (2006.01)
(Continued)

(52) U.S. Cl.
CPC .......... *G06F 3/0414* (2013.01); *G06F 3/0412* (2013.01); *H01L 27/20* (2013.01);
(Continued)

(58) Field of Classification Search
CPC ................ G06F 3/0412; G06F 3/0414; G06F 2203/04103; H01L 41/0478;
(Continued)

(56) References Cited

U.S. PATENT DOCUMENTS 6,198,203 B1 * 3/2001 Hotomi ................ B41J 2/14233
                                                310/324
9,405,143 B2 * 8/2016 Li ........................ G02F 1/13394
(Continued)

FOREIGN PATENT DOCUMENTS

CN        103455202 A     12/2013
CN        103676240 A      3/2014
(Continued)

OTHER PUBLICATIONS

First Chinese Office Action, for Chinese Patent Application No. 201610147019.8, dated Aug. 30, 2017, 11 pages.
(Continued)

*Primary Examiner* — Jason M Mandeville
(74) *Attorney, Agent, or Firm* — Kinney & Lange, P.A.

(57) ABSTRACT

Embodiments of the present invention relates to the field of display technology, and particularly to a pressure force touch
(Continued)

panel and a method for manufacturing the same, and a display apparatus including the abovementioned pressure force touch panel. In one embodiment, the pressure force touch panel comprises an array substrate and a color film substrate assembling with each other, and, the color film substrate comprises a black matrix, a plurality of spacers are provided at a side of the color film substrate facing the array substrate; grooves, in one-to-one correspondence with at least some of the spacers, are provided in a side surface of the array substrate facing the color film substrate, and a piezoelectric mechanism electrically connected to a detection circuit is mounted in each of the grooves and is located within a region of projection of the black matrix onto the array substrate; wherein, the piezoelectric mechanism generates an electrical signal when the spacer is pressed against the corresponding piezoelectric mechanism.

18 Claims, 4 Drawing Sheets

(51) Int. Cl.
| | | |
|---|---|---|
| | *H01L 41/047* | (2006.01) |
| | *H01L 41/113* | (2006.01) |
| | *H01L 41/187* | (2006.01) |
| | *H01L 41/25* | (2013.01) |
| | *H01L 41/29* | (2013.01) |
| | *H01L 41/314* | (2013.01) |

(52) U.S. Cl.
CPC ...... *H01L 41/0478* (2013.01); *H01L 41/1132* (2013.01); *H01L 41/187* (2013.01); *H01L 41/25* (2013.01); *H01L 41/29* (2013.01); *G06F 2203/04103* (2013.01); *H01L 41/314* (2013.01)

(58) Field of Classification Search
CPC ... H01L 41/1132; H01L 41/187; H01L 41/25; H01L 41/29; H01L 41/314; H01L 27/20
USPC .......................................................... 345/174
See application file for complete search history.

(56) References Cited

U.S. PATENT DOCUMENTS

| | | | | |
|---|---|---|---|---|
| 9,715,294 | B2* | 7/2017 | Zhang | ............... G06F 3/0412 |
| 10,103,651 | B2* | 10/2018 | Jeong | ..................... H02N 2/18 |
| 2010/0225608 | A1* | 9/2010 | Zhou | ................ G02F 1/13338 |
| | | | | 345/173 |
| 2014/0347283 | A1 | 11/2014 | Kim et al. | |
| 2015/0035411 | A1* | 2/2015 | Kawamura | ............... G01L 1/16 |
| | | | | 310/330 |
| 2015/0253849 | A1 | 9/2015 | Kim et al. | |
| 2015/0261367 | A1* | 9/2015 | Zhang | ................ G06F 3/0412 |
| | | | | 345/173 |
| 2016/0065094 | A1* | 3/2016 | Jeong | ..................... H02N 2/18 |
| | | | | 310/319 |

FOREIGN PATENT DOCUMENTS

| | | |
|---|---|---|
| CN | 104834121 A | 8/2015 |
| JP | H05333990 A | 12/1993 |
| JP | 2004038581 A | 2/2004 |
| KR | 20100043770 A | 4/2010 |

OTHER PUBLICATIONS

International Search Report and Written Opinion (including English translation of Box V) for PCT Patent Application No. PCT/CN2016/087439, dated Nov. 30, 2016, 14 pages.

* cited by examiner

PRESSURE FORCE TOUCH PANEL AND METHOD FOR MANUFACTURING THE SAME, AND DISPLAY APPARATUS

CROSS-REFERENCE TO RELATED APPLICATION

This application claims the benefit of Chinese Patent Application No. 201610147019.8 filed on Mar. 15, 2016 in the State Intellectual Property Office of China, the whole disclosure of which is incorporated herein by reference.

BACKGROUND

1. Technical Field

Embodiments of the present invention generally relate to the field of display technology, and particularly to a pressure force touch panel and a method for manufacturing the same, and a display apparatus.

2. Description of the Related Art

At present, touch panel has been widely used in portable terminals such as mobile phone, tablet computer (PAD), and notebook computer and other display apparatuses, and, in accordance with the principle of touch action, conventional touch panels can be divided into resistive touch panels, capacitive touch panels, optical touch panels, sonic touch panel and the like. Recently, in-cell touch panel in which touch electrodes are embedded inside display screen has become the trend of development because it can achieve thinning, light weight of the panel and improve sensitivity of touch action. However, the skilled in the art face a technical problem that how to use a piezoelectric mechanism to realize the in-cell touch panel.

SUMMARY

According to one aspect of embodiments of the present invention, there is provided a pressure force touch panel comprises an array substrate and a color film substrate assembling with each other, the color film substrate comprises a black matrix, a plurality of spacers are provided at a side of the color film substrate facing the array substrate; grooves, in one-to-one correspondence with at least some of the spacers, are provided in a side surface of the array substrate facing the color film substrate, and a piezoelectric mechanism electrically connected to a detection circuit is mounted in each of the grooves and is located within a region of projection of the black matrix onto the array substrate; wherein, the piezoelectric mechanism generates an electrical signal when the spacer is pressed against the corresponding piezoelectric mechanism.

In some embodiments, the piezoelectric mechanism comprises a first electrode, a piezoelectric material, an insulation layer, a second electrode and an elastic material disposed in sequence within the groove from the color film substrate to the array substrate; the first electrode is electrically connected to the detection circuit, for detecting a positive voltage or a negative voltage generated by the piezoelectric material after being pressed; and, the second electrode is electrically connected to the detection circuit, for detecting a negative voltage or a positive voltage generated by the piezoelectric material after being pressed.

In some embodiments, the second electrode comprises an electrode made of metal material.

In some embodiments, the second electrode comprises an electrode made of tin indium oxide (ITO) material.

In some embodiments, the insulation layer comprises an insulation layer made of silicon oxide or silicon nitride material.

In some embodiments, the piezoelectric material comprises zinc oxide material or aluminum nitride material.

In some embodiments, the elastic material comprises material for the spacer or silica gel material.

In some embodiments, a portion of the array substrate where the grooves are provided is divided into a plurality of piezoelectric regions, a plurality of said grooves are included in each of the piezoelectric regions, and, the piezoelectric mechanisms in the grooves of each of the piezoelectric regions are connected in series and then are electrically connected to the detection circuit.

In some embodiments, the piezoelectric mechanisms in each of the piezoelectric regions are connected in series through metal material.

According to another aspect of embodiments of the present invention, there is provided a display apparatus comprising any one of the pressure force touch panels according to abovementioned technical solutions.

According to yet another aspect of embodiments of the present invention, there is provided a method for manufacturing any one of the pressure force touch panels according to abovementioned technical solutions, the method comprises:

forming an array substrate and a color film substrate, wherein, the color film substrate is provided thereon with a black matrix, a plurality of spacers are provided at a side of the color film substrate facing the array substrate; grooves, in one-to-one correspondence with at least some of the spacers, are provided in a side surface of the array substrate facing the color film substrate, forming a piezoelectric mechanism in each of the grooves, wherein the piezoelectric mechanism is located within a region of projection of the black matrix onto the array substrate; and assembling the array substrate and the color film substrate with each other.

In some embodiments, the step of forming the piezoelectric mechanism in each of the grooves, specifically comprises:

filling the groove with an elastic material;
forming a second electrode on the elastic material;
forming an insulation layer on the second electrode;
forming a piezoelectric material on the insulation layer; and
forming a first electrode on the piezoelectric material.

In some embodiments, the method further comprises: dividing a portion of the array substrate where the grooves are provided into a plurality of piezoelectric regions, wherein a plurality of said grooves are included in each of the piezoelectric regions; and, connecting the piezoelectric mechanisms in the grooves of each of the piezoelectric regions in series.

In some embodiments, the method further comprises: connecting the piezoelectric mechanisms in each of the piezoelectric regions in series through metal material.

DETAILED DESCRIPTION OF THE EMBODIMENTS

Technical solutions according to embodiments of the present invention will be described hereinafter clearly and completely with reference to the attached drawings. Obviously, the embodiments illustrated in these drawings are only some of embodiments of the present invention, instead of all of the embodiments of the present invention. For those skilled in the art, other embodiments achieved by referring to the following embodiments without involving any inventive steps fall into the scope of the present invention.

Embodiments of the present invention provide a pressure force touch panel, which is an in-cell touch panel and which is improved in sensitivity of touch action and achieves thinning and light weight. Correspondingly, embodiments of the present invention further provide a method for manufacturing the abovementioned pressure force touch panel and a display apparatus including the pressure force touch panel.

Figure 1:
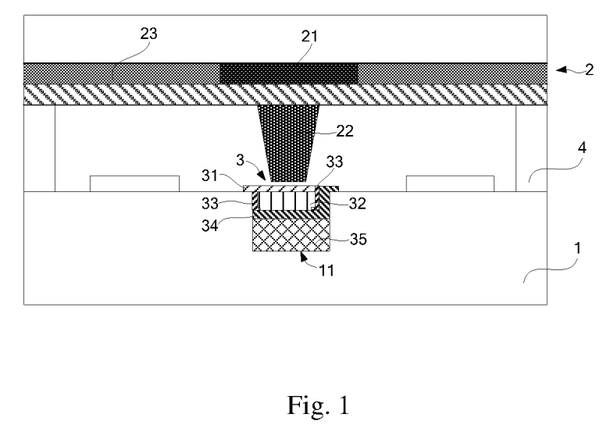
FIG. 1 is a structural schematic view of a pressure force touch panel according to an embodiment of the present invention.
Figure 2:
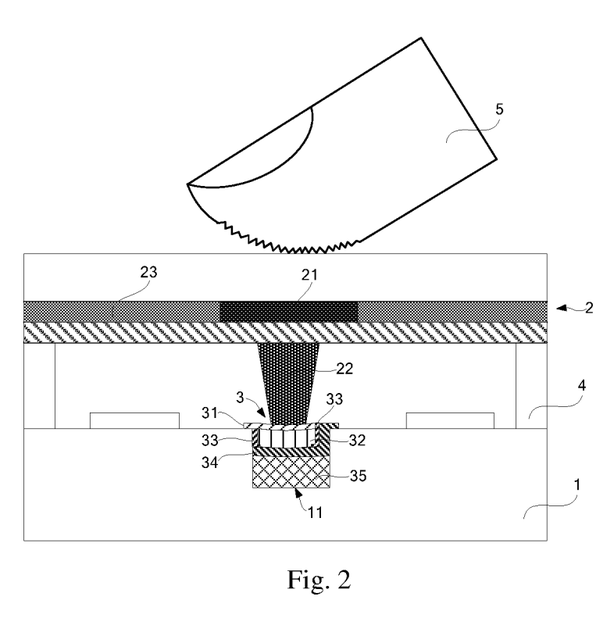
FIG. 2 is a schematic view of working principle of the pressure force touch panel shown in FIG. 1 under a touch action with a finger.

Please refer to FIG. 1 and FIG. 2, a pressure force touch panel according to an embodiment of the present invention comprises an array substrate 1 and a color film substrate 2 assembling with each other, the color film substrate 2 comprises a black matrix 21, a plurality of spacers 22 are provided at a side of the color film substrate 2 facing the array substrate 1; grooves 11, in one-to-one correspondence with at least some of the spacers 22, are provided in a side surface of the array substrate 1 facing the color film substrate 2, and a piezoelectric mechanism 3 electrically connected to a detection circuit is mounted in each of the grooves 11 and is located within a region of projection of the black matrix 21 onto the array substrate 1; wherein, the piezoelectric mechanism 3 generates an electrical signal when the spacer 22 is pressed against the corresponding piezoelectric mechanism 3.

During use of this pressure force touch panel, when a finger 5 is pressed on the pressure force touch panel, the press operation of the finger 5 makes the spacer 22 in a position corresponding to location of the finger 5 to press against a corresponding piezoelectric mechanism 3, in the pressure force touch panel, the piezoelectric mechanism 3 generates an electrical signal, and the detection circuit electrically connected to the piezoelectric mechanism 3 detects the electrical signal and thus determines location and gesture of touch action of the finger 5, to achieve a corresponding touch operation. Since the piezoelectric mechanisms 3 are mounted in the grooves 11 of the array substrate 1, provision of the piezoelectric mechanisms 3 within the array substrate forms an in-cell structure. As a result, this pressure force touch panel is an in-cell touch panel and is improved in sensitivity of touch action and achieves thinning and light weight.

As shown in FIG. 1 and FIG. 2, the color film substrate 2 of the abovementioned pressure force touch panel may further comprise a color film 23, and the array substrate 1 and the color film substrate 2 may be tightly connected through sealing adhesive 4.

In one specific implementation, the piezoelectric mechanism 3 comprises a first electrode 31, a piezoelectric material 32, an insulation layer 33, a second electrode 34 and an elastic material 35 disposed in sequence within the groove 11 from the color film substrate 1 to the array substrate 2; the first electrode 31 is electrically connected to the detection circuit, for detecting a positive charge generated by the piezoelectric material 32 after being pressed; and, the second electrode 34 is electrically connected to the detection circuit, for detecting a negative charge generated by the piezoelectric material 32 after being pressed.

The piezoelectric mechanism 3 of the abovementioned pressure force touch panel comprises a piezoelectric material 32, and, upper surface of the piezoelectric material 32 is electrically connected to the first electrode 31, lower surface of the piezoelectric material 32 is electrically connected to the second electrode 34, the first electrode 31 and the second electrode 34 of the piezoelectric mechanism 3 are electrically insulated through insulation layer 33. During a normal use of the pressure force touch panel, when a finger 5 is pressed on the pressure force touch panel, the spacer 22 in a position corresponding to location of the finger 5 is pressed against a corresponding piezoelectric mechanism 3. The elastic material 35 of the piezoelectric mechanism 3 is deformed after being pressed, and since the elastic material 35 supporting the piezoelectric material 32 is deformed by being pressed by the finger 5, the piezoelectric material 32 is deformed accordingly upon deformation of the elastic material 35. After deformation of the piezoelectric material 32, positive charges are generated in the upper surface of the piezoelectric material 32 while negative charges are generated in the lower surface of the piezoelectric material 32 accordingly. Voltage difference between the upper surface of the piezoelectric material 32 and the lower surface of the piezoelectric material 32 are detectable by the detection circuit, and, the voltage difference between the upper surface of the piezoelectric material 32 and the lower surface of the piezoelectric material 32 is in proportion to a pressure force of the finger 5, accordingly, location and size of the press action of the finger 5 can be detected accurately, which improves sensitivity of the touch panel.

Specifically, the first electrode 31 may be an electrode made of metal material lying in the same layer with a gate or a source and a drain. The second electrode 34 may be an electrode made of metal material, and the second electrode 34 may also be made of tin indium oxide (ITO) material. Moreover, materials for the first electrode 31 and for the second electrode 34 may be the same or may be different. The insulation layer 33 may be an insulation layer made of silicon oxide or silicon nitride material. The piezoelectric material 32 may be zinc oxide material or aluminum nitride material.

In order to increase degree of deformation of the piezoelectric material when a finger 5 is pressed against the pressure force touch panel so as to generate a greater piezoelectric signal, the elastic material 35 may be material for the spacer or silica gel material.

Figure 3:
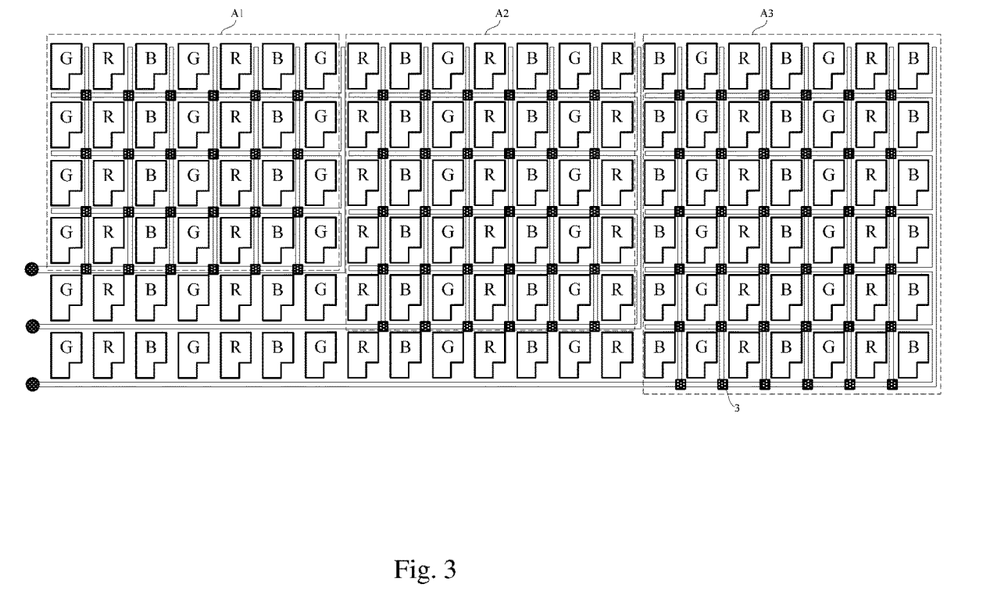
FIG. 3 is a view showing one division manner of a plurality of piezoelectric regions in an array substrate of the pressure force touch panel shown in FIG. 1.
Figure 4:
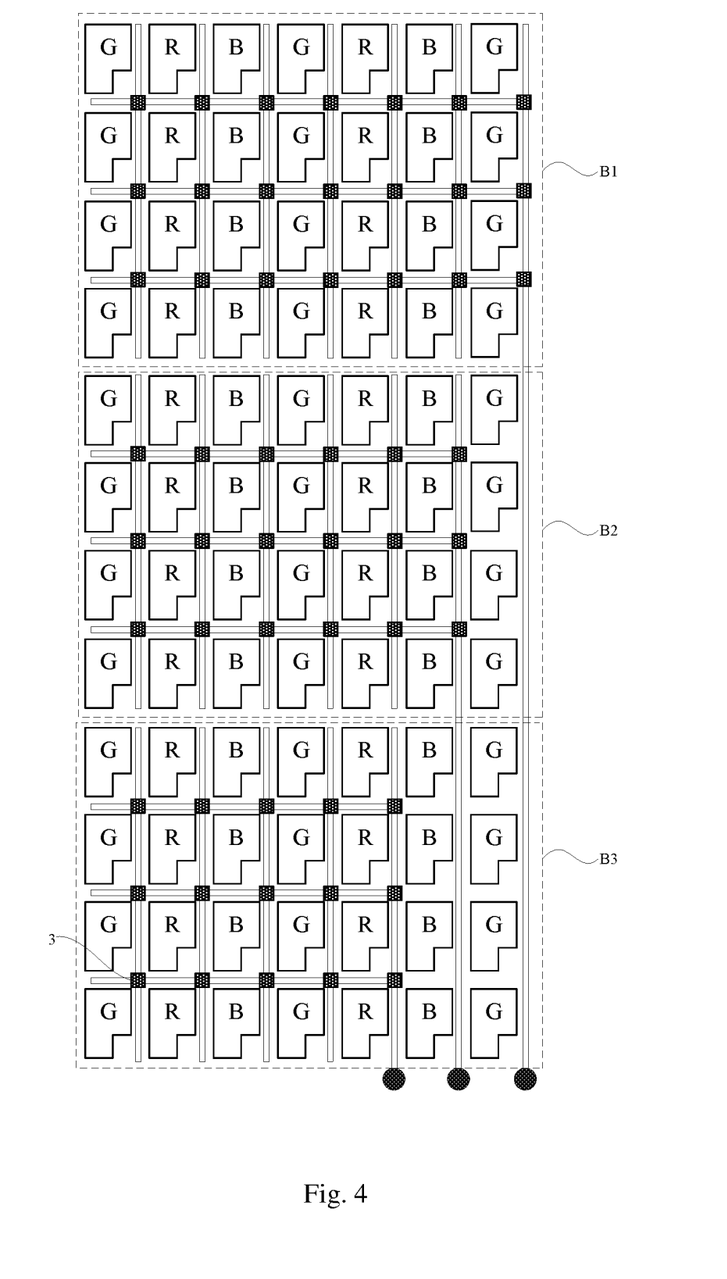
FIG. 4 is a view showing another division manner of the plurality of piezoelectric regions in the array substrate of the pressure force touch panel shown in FIG. 1.

In order to detect magnitudes of the pressure force of a finger 5 applied on the pressure force touch panel, referring to FIG. 3 and FIG. 4, a portion of the array substrate 1 where the grooves are provided is divided into a plurality of piezoelectric regions, such as piezoelectric region A1, piezoelectric region A2 and piezoelectric region A3 divided on the array substrate 1 as shown in FIG. 3; and, piezoelectric region B1, piezoelectric region B2 and piezoelectric region B3 divided on the array substrate 1 as shown in FIG. 4. A plurality of grooves are included in each of the piezoelectric regions. For example, in FIG. 3, the piezoelectric region A1 comprises twenty-four grooves; and, in FIG. 4, the piezoelectric region B2 comprises eighteen grooves; and, the piezoelectric mechanisms 3 in the grooves of each of the piezoelectric regions are connected in series and then are electrically connected to the detection circuit. Standard for division of the plurality of piezoelectric regions may be similar to that of the touch electrodes, for example, pitch of 5 mm*5 mm may be adopted. Positioning of the pressure force point can be achieved conveniently by dividing a portion of the array substrate where the grooves are provided into a plurality of piezoelectric regions.

In the abovementioned pressure force touch panel, a portion of the array substrate 1 where the grooves are provided is divided into a plurality of piezoelectric regions, and, the piezoelectric mechanisms 3 in the grooves of each of the piezoelectric regions are connected in series and then are electrically connected to the detection circuit. As shown in FIG. 3, eighteen piezoelectric mechanisms 3 in eighteen grooves within the piezoelectric region A1 are connected in series, which makes all of the positive charges on the upper surfaces of the piezoelectric materials 32 and the negative charges on the lower surfaces of the piezoelectric materials 32 within the piezoelectric region A1 to be accumulated, to increase quantity of the charges on both upper and lower surfaces of all of the piezoelectric materials 32 within the piezoelectric region A1, so as to form voltage difference between the upper surfaces of the piezoelectric materials 32 and the lower surfaces of the piezoelectric materials 32. Since the voltage difference is in proportion to a pressure force of the finger 5, size of the pressure force of the finger 5 against the pressure force touch panel can be detected accurately, which further improves sensitivity of the touch panel.

Furthermore, the piezoelectric mechanisms 3 in each of the piezoelectric regions are connected in series through metal conductive material. Of course, other electrically conductive material may also be used to connect the piezoelectric mechanisms 3 in each of the piezoelectric regions in series.

Embodiments of the present invention further provide a display apparatus comprising any one of the pressure force touch panels according to abovementioned embodiments.

Figure 5:
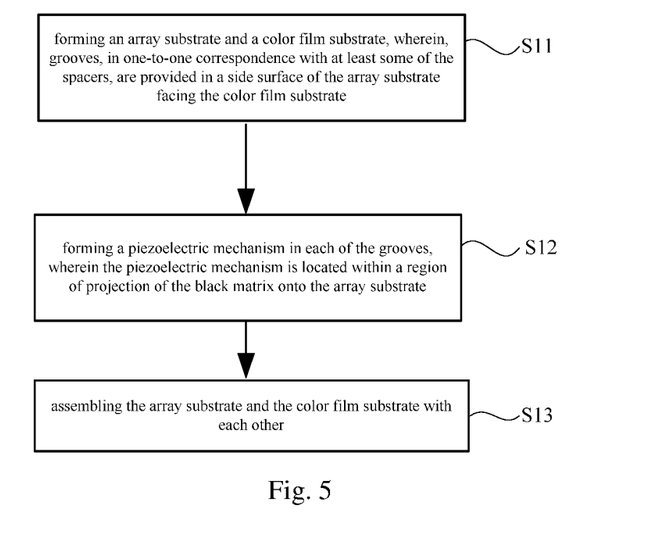
FIG. 5 is a process chart of a method for manufacturing a pressure force touch panel according to an embodiment of the present invention.

In addition, please refer to FIG. 5, embodiments of the present invention further provide a method for manufacturing any one of the pressure force touch panels according to abovementioned embodiments, the method comprises the followings:

a step S11 of, forming an array substrate 1 and a color film substrate 2, wherein, the color film substrate 2 is provided thereon with a black matrix 21, a plurality of spacers 22 are provided at a side of the color film substrate 2 facing the array substrate 1; grooves 11, in one-to-one correspondence with at least some of the spacers 22, are provided in a side surface of the array substrate 1 facing the color film substrate 2;

a step S12 of, forming a piezoelectric mechanism 3 in each of the grooves 11, wherein the piezoelectric mechanism 3 is located within a region of projection of the black matrix 21 onto the array substrate 1; and a step S13 of, assembling the array substrate 1 and the color film substrate 2 with each other.

Figure 6:
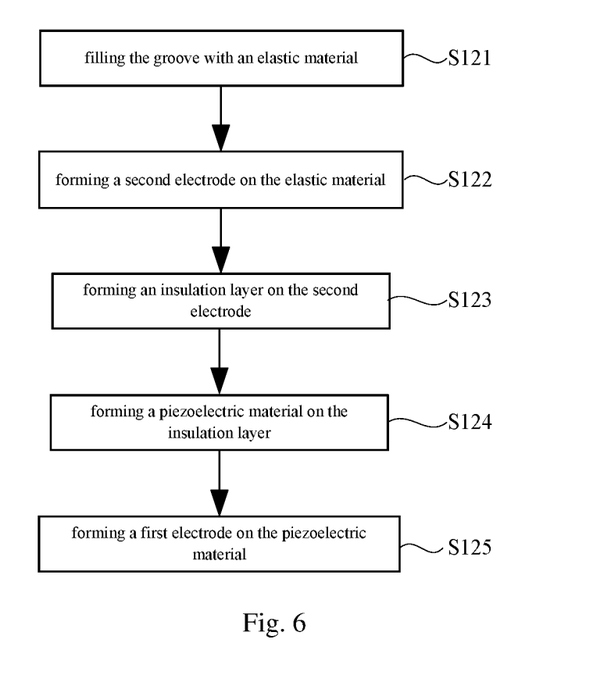
FIG. 6 is a process chart of specific steps of forming piezoelectric mechanism in grooves of an array substrate during manufacture of the pressure force touch panel shown in FIG. 5.

Particularly, referring to FIG. 6, the step S12 of forming the piezoelectric mechanism 3 in each of the grooves 11, specifically comprises the following steps:

a step S121 of, filling the groove 11 with an elastic material 35;

a step S122 of, forming a second electrode 34 on the elastic material 35;

a step S123 of, forming an insulation layer 33 on the second electrode 34;

a step S124 of, forming a piezoelectric material 32 on the insulation layer 33; and a step S125 of, forming a first electrode 31 on the piezoelectric material 32.

In some embodiments, the abovementioned method for manufacturing the pressure force touch panel may further comprise the following steps:

dividing a portion of the array substrate 1 where the grooves 11 are provided into a plurality of piezoelectric regions, wherein a plurality of the grooves 11 are included in each of the piezoelectric regions; and, connecting the piezoelectric mechanisms 3 in the grooves 11 of each of the piezoelectric regions in series.

In some embodiments, the abovementioned method for manufacturing the pressure force touch panel may further comprise the following steps:

connecting the piezoelectric mechanisms 3 in each of the piezoelectric regions in series through metal material.

Concerning the above, with the abovementioned pressure force touch panel and the method for manufacturing the same and the display apparatus including the pressure force touch panel provided by embodiments of the present invention, during use of this pressure force touch panel, when a finger is pressed on the pressure force touch panel, the press operation of the finger makes the spacer in a position corresponding to location of the finger to press against a corresponding piezoelectric mechanism, in the pressure force touch panel, the piezoelectric mechanism generates an electrical signal, and the detection circuit electrically connected to the piezoelectric mechanism detects the electrical signal and thus determines location and gesture of touch action of the finger, to achieve a corresponding touch operation. Since the piezoelectric mechanisms are mounted in grooves of the array substrate, provision of the piezoelectric mechanisms within the array substrate forms an in-cell structure. As a result, this pressure force touch panel is improved in sensitivity of touch action and achieves thinning and light weight.

Obviously, for those skilled in the art, various changes and modifications can be made in embodiments of the present invention without departing from the principles and spirit of the invention. The present invention intends to contain these changes and modifications once these changes and modifications fall into the principles and spirit of the present invention, the scope of which is defined in the claims and their equivalents.

What is claimed is:

1. A pressure force touch panel, comprising an array substrate and a color film substrate assembling with each other, wherein:

the color film substrate comprises a black matrix;

a plurality of spacers are provided at a side of the color film substrate facing the array substrate;

grooves, in one-to-one correspondence with at least some of the spacers, are provided in a side surface of the array substrate facing the color film substrate; and a piezoelectric mechanism electrically connected to a detection circuit is mounted in each of the grooves and is located within a region of projection of the black matrix onto the array substrate;

wherein, the piezoelectric mechanism generates an electrical signal when the spacer is pressed against the corresponding piezoelectric mechanism;

the piezoelectric mechanism comprises a first electrode, a piezoelectric material, an insulation layer, a second electrode and an elastic material disposed in sequence within the groove from the color film substrate to the array sub state;

the first electrode is electrically connected to the detection circuit, for detecting a positive charge generated by the piezoelectric material after being pressed; and the second electrode is electronically connected to the detection circuit, for detecting a negative charge generated by the piezoelectric material after being pressed.

2. The pressure force touch panel of claim 1, wherein, the second electrode comprises an electrode made of metal material.

3. The pressure force touch panel of claim 1, wherein, the second electrode comprises an electrode made of tin indium oxide material.

4. The pressure force touch panel of claim 1, wherein, the insulation layer comprises an insulation layer made of silicon oxide or silicon nitride material.

5. The pressure force touch panel of claim 1, wherein, the piezoelectric material comprises zinc oxide material or aluminum nitride material.

6. The pressure force touch panel of claim 1, wherein, the elastic material comprises material for the spacer or silica gel material.

7. The pressure force touch panel of claim 1, wherein, a portion of the array substrate where the grooves are provided is divided into a plurality of piezoelectric regions, a plurality of said grooves are included in each of the piezoelectric regions, and, the piezoelectric mechanisms in the grooves of each of the piezoelectric regions are connected in series and then are electrically connected to the detection circuit.

8. The pressure force touch panel of claim 7, wherein, the piezoelectric mechanisms in each of the piezoelectric regions are connected in series through metal material.

9. A display apparatus comprising the pressure force touch panel of claim 1.

10. A method for manufacturing a pressure force touch panel, the method comprising:

forming an array substrate and a color film substrate, wherein, the color film substrate is provided thereon with a black matrix, a plurality of spacers are provided at a side of the color film substrate facing the array substrate; grooves, in one-to-one correspondence with at least some of the spacers, are provided in a side surface of the array substrate facing the color film substrate;

forming a piezoelectric mechanism in each of the grooves, wherein the piezoelectric mechanism is located within a region of projection of the black matrix onto the array substrate and is electrically connected to a detection circuit: and assembling the array substrate and the color film substrate with each other; wherein the piezoelectric mechanism comprises a first electrode, a piezoelectric material, an insulation layer, a second electrode and an elastic material disposed in sequence within the groove from the color film substrate to the array substrate;

the first electrode is electrically connected to the detection circuit, for detecting a positive charge generated by the piezoelectric material after being pressed; and the second electrode is electrically connected to the detection circuit, for detecting a negative charge generated by the piezoelectric material after being pressed.

11. The method of claim 10, wherein the step of forming the piezoelectric mechanism in each of the grooves comprises:

filling the groove with an elastic material;
forming a second electrode on the elastic material;
forming an insulation layer on the second electrode;
forming a piezoelectric material on the insulation layer; and
forming a first electrode on the piezoelectric material.

12. The method of claim 10, further comprising,
dividing a portion of the array substrate where the grooves are provided into a plurality of piezoelectric regions, wherein a plurality of said grooves are included in each of the piezoelectric regions; and,
connecting the piezoelectric mechanisms in the grooves of each of the piezoelectric regions in series.

13. The method of claim 12, further comprising,
connecting the piezoelectric mechanisms in each of the piezoelectric regions in series through metal material.

14. The display apparatus of claim 9, wherein, in the pressure force touch panel,
the second electrode comprises an electrode made of metal material or tin indium oxide material;
the insulation layer comprises an insulation layer made of silicon oxide or silicon nitride material;
the piezoelectric material comprises zinc oxide material or aluminum nitride material; and
the elastic material comprises material for the spacer or silica gel material.

15. The display apparatus of claim 9, wherein, in the pressure force touch panel,
a portion of the array substrate where the grooves are provided is divided into a plurality of piezoelectric regions;
a plurality of said grooves are included in each of the piezoelectric regions; and
the piezoelectric mechanisms in the grooves of each of the piezoelectric regions are connected in series and then are electrically connected to the detection circuit.

16. The display apparatus of claim 15, wherein, in the pressure force touch panel, the piezoelectric mechanisms in each of the piezoelectric regions are connected in series through metal material.

17. The method of claim 11, further comprising:
electrically connecting the first electrode to the detection circuit, for detecting a positive charge generated by the piezoelectric material after being pressed; and
electrically connecting the second electrode to the detection circuit, for detecting a negative charge generated by the piezoelectric material after being pressed.

18. The method of claim 17, wherein:
the second electrode comprises an electrode made of metal material or tin indium oxide material;
the insulation layer comprises an insulation layer made of silicon oxide or silicon nitride material;
the piezoelectric material comprises zinc oxide material or aluminum nitride material; and the elastic material comprises material for the spacer or silica gel material.

* * * * *